United States Patent [19]

Sato et al.

[11] Patent Number: 4,957,591
[45] Date of Patent: Sep. 18, 1990

[54] METHOD FOR PREPARING NEEDLE-LIKE, FIBROUS OR POROUS DIAMOND, OR AN AGGREGATE THEREOF

[75] Inventors: Yoichiro Sato; Mutsukazu Kamo, both of Tsukuba; Chiemi Hata, Tachikawa, all of Japan

[73] Assignee: National Institute for Research in Inorganic Materials, Tsukuba, Japan

[21] Appl. No.: 281,650

[22] Filed: Dec. 9, 1988

[30] Foreign Application Priority Data

Mar. 29, 1988 [JP] Japan ................................. 63-75161

[51] Int. Cl.⁵ ...................... B44C 1/22; C03C 15/00; C03C 25/06
[52] U.S. Cl. .................................. 156/643; 156/345; 156/644; 156/646; 156/654; 156/655; 156/657; 156/662; 204/192.35; 252/79.1; 427/38
[58] Field of Search ............... 156/345, 643, 644, 646, 156/654, 655, 662, 663, 657; 252/79.1; 427/38, 39; 204/192.32, 192.35

[56] References Cited

U.S. PATENT DOCUMENTS

| | | | |
|---|---|---|---|
| 2,806,961 | 8/1957 | Horn | 156/644 X |
| 4,339,304 | 7/1982 | Grigoriev et al. | 156/635 |
| 4,816,113 | 3/1989 | Shunpei | 156/643 |
| 4,832,997 | 5/1989 | Balanzat et al. | 156/644 X |

Primary Examiner—William A. Powell
Attorney, Agent, or Firm—Oblon, Spivak, McClelland, Maier & Neustadt

[57] ABSTRACT

A method for preparing needle-like, fibrous or porous diamond, or an aggregate thereof, which comprises subjecting diamond synthesized by a chemical vapor deposition method or a plasma-assisted vapor deposition method, or a film of such diamond, to plasma treatment in a gas stream containing oxygen, carbon dioxide, steam, hydrogen, a halogenated hydrocarbon or a halogenated carbon, or to thermal oxidation treatment in a gas stream containing oxygen, carbon dioxide or steam, for etching.

12 Claims, 2 Drawing Sheets

METHOD FOR PREPARING NEEDLE-LIKE, FIBROUS OR POROUS DIAMOND, OR AN AGGREGATE THEREOF

BACKGROUND OF THE INVENTION

1. Field of the Invention

The present invention relates to a method for preparing needle-like, fibrous or porous diamond, or an aggregate thereof.

2. Discussion of Background

By virtue of its excellent properties such as extremely high hardness, heat conductivity, modulus of elasticity and chemical stability, diamond is expected to have a wide range of applications. However, the practical application is presently rather limited mainly because the technology for the synthesis has not yet been adequately developed to have the morphology, texture or function required for particular purposes. If it is possible to synthesize needle-like, fibrous or porous diamond, or an aggregate thereof, such diamond may be used as a filler material in combination with metals, plastics, ceramics and various other materials to obtain composite materials, whereby it will be useful in various fields as a material having excellent mechanical and thermal properties such as high strength, high abrasion resistance and high thermal conductivity.

Heretofore, for the synthesis of needle-like or fibrous diamond, a method has been known wherein a transition metal powder such as iron or nickel is utilized in a chemical vapor deposition method or a plasma-assisted vapor deposition method developed by the present applicant. This is a method wherein a gas mixture of a hydrocarbon and hydrogen is excited and dissociated by heated filaments, by high frequency plasma or by microwave plasma, so that needle-like or fibrous diamond is precipitated on a substrate on which a transition metal powder is deposited (Japanese Unexamined Patent Publication No. 158195/1987). No other methods have been known. Further, no method has been known for the production of porous diamond.

It is an object of the present invention to provide a method for readily and efficiently produce needle-like, fibrous or porous diamond, or an aggregate thereof in a manner which is fundamentally different in the principle from the above-mentioned conventional methods.

SUMMARY OF THE INVENTION

The present inventors have conducted detailed studies on the morphology, textures, structures, crystal grain boundaries, etc. of diamonds formed under various conditions by a chemical vapor deposition method or a plasma-assisted vapor deposition method. As a result, it has been found that the morphology or structures of the diamonds can be classified depending upon the conditions for the synthesis into (1) a polycrystal or film having a typical columnar structure or an orientation in which crystallites are grown in the direction perpendicular to the substrate surface, (2) a single crystal having a typical shape specific to diamond, and a polycrystal or film having a structure in which crystallites are randomly oriented, and (3) a polycrystal or film having intermediate characteristics between the preceding two. Morphology, textures or structures of diamond films depend most strongly on gas composition and temperature of substrate. The texture of type (1) appears when the carbon content or concentration of carbon containing gas in the starting gas mixture is relatively high, and the texture gradually changes to (3) and then (2) as the carbon content is lowered, with other conditions being the same. Control of texture is also feasible by changing the substrate temperature: At relatively high temperature, type (1) texture appears and as the temperature is lowered, the texture varies to (3) and then (2), with other conditions being the same. These tendencies hold for plasma-assisted vapor deposition methods as well as for thermally excited chemical vapor deosition methods. It has been found anew that when diamonds having such structures or textures are subjected to plasma treatment or thermal oxidation treatment in a gas stream containing various gases or reagents, they will be etched by the gases or reagents, whereby needle like or fibrous diamonds can readily and efficiently be obtained in the case of the above (1), and porous diamonds can readily and efficiently be obtained in the case (2). The present invention has been accomplished on the basis of these discoveries.

The present invention provides a method for preparing needle-like, fibrous or porous diamond, or an aggregate thereof, which comprises subjecting diamond synthesized by a chemical vapor deposition method or by a plasma-assisted vapor deposition method, or a film of such diamond, to plasma treatment in a gas stream containing oxygen, carbon dioxide, steam, hydrogen, a halogenated hydrocarbon or a halogenated carbon, or to thermal oxidation treatment in a gas stream containing oxygen, carbon dioxide or steam, for etching.

DETAILED DESCRIPTION OF THE PREFERRED EMBODIMENTS

Figure 1:
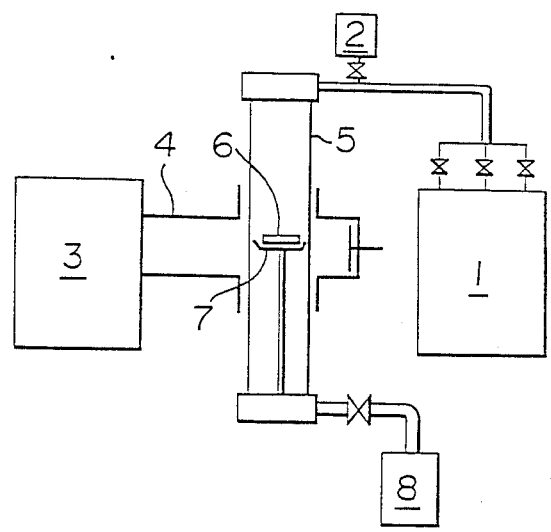
FIGS. 1 and 2 show apparatus for etching treatment by means of plasma.

The diamond to be used in the method of the present invention is required to be the one synthesized by a chemical vapor deposition method or by a plasma-assisted vapor deposition method. With natural single crystal diamond or with single crystal diamond synthesized by a high pressure method using a metal catalyst, the effects of the present invention can not be obtained.

The plasma-assisted vapor deposition method includes, for example, a method wherein a starting material gas composed of a gas mixture of hydrogen and a carbon-containing gas such as a hydrocarbon, carbon monoxide, an alcohol or acetone, is activated by discharge by means of microwave, high frequency or direct current, to form a plasma, whereby diamond is precipitated on a substrate made of various material such as silicon, molybdenum or tantalum.

The chemical vapor deposition method includes, for example, a method wherein a coil of a tungsten or tantalum wire is heated to a high temperature of about 2,000° C. by conducting an electric current, whereby a starting material gas composed of a gas mixture of hydrogen and a carbon-containing gas such as a hydrocarbon, carbon monoxide, an alcohol or acetone, is dissociated and excited, and diamond is precipitated on a substrate made of various material such as silicon, molybdenum or tantalum. Further, this method has a modification in which a potential difference is provided between the heated tungsten wire and the substrate. There is a photo-chemically assisted chemical vapor deposition method wherein the starting material gas is dissociated and excited by light beams such as laser beams or ultraviolet rays. There is a simple and unique method in which diamond is deposited on a substrate which is put into a proper position of combustion flame: Gases like acetylene or methane is burned in air either mixed with hydrogen or without. The method is a modification of chemical vapor deposition method in which high temperature caused by combustion is utilized for producing reactive species.

However, the present invention is not limited by such specific methods. Any diamond polycrystal or its film synthesized by the chemical vapor deposition method or by the plasma-assisted vapor deposition method and having a columnar structure or an orientation in which crystallites are grown in the direction perpendicular to the substrate surface, may be used as the starting material for needle-like or fibrous diamond. Likewise, a single crystal and a polycrystal or its film wherein crystallites are randomly oriented, synthesized by the chemical vapor deposition method or by the plasma-assisted vapor deposition method, may be used as the starting material for porous diamond. The morphology, structure and texture of diamond can be acertained by the observation by means of e.g. a scanning electron microscope. For the synthesis of such diamond by the plasma-assisted vapor deposition method, the apparatus for etching treatment as shown in FIGS. 1 and 2 may be employed.

The etching can be conducted by either plasma treatment or thermal oxidation treatment. In the plasma treatment, the starting material diamond is subjected to plasma treatment in a gas stream containing oxygen, carbon dioxide, steam, hydrogen, a halogenated hydrocarbon or a halogenated carbon.

Figure 2:
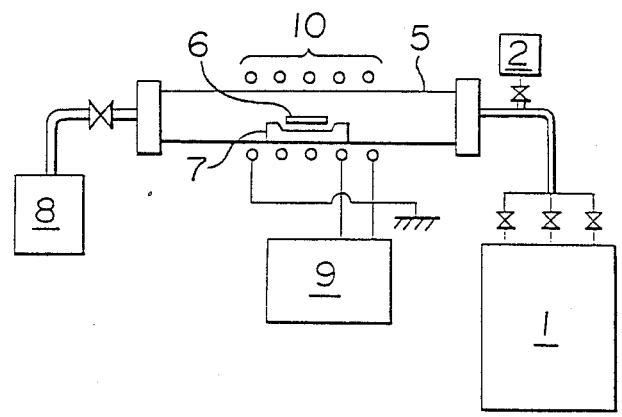

The plasma treatment can be conducted by means of apparatus as shown in FIGS. 1 and 2. FIG. 1 illustrates an apparatus wherein a microwave (2450 MHz) is used as the excitation source. In FIG. 1, reference numeral 1 designates a gas supply device, numeral 2 designates a pressure gauge, numeral 3 designates a microwave oscillator, numeral 4 designates a wave guide, numeral 5 designates a reaction chamber, numeral 6 designates a substrate, numeral 7 designates a substrate holder, and numeral 8 designates an evacuation device. Diamond to be treated is placed on the substrate 6. While supplying the above-mentioned reactive gas for etching from the gas supply device 1 into the reaction chamber 5, the evacuation device 8 is operated to bring the pressure to a desired level. A microwave is generated by the microwave oscillator 3 and conducted to the reaction chamber 5 by the wave guide 4 to generate a plasma in the reactive gas.

FIG. 2 shows an apparatus wherein a high frequency (13.5 MHz) is used as the excitation source. In FIG. 2, reference numeral 9 designates a high frequency oscillator, numeral 10 designates a work coil, and other numerals represent the same elements as in FIG. 1. The operation of the apparatus is also the same as described with respect to FIG. 1 except that the high frequency oscillator 9 is used instead of the microwave oscillator.

The plasma treatment is preferably conducted under reduced pressure. If the pressure is high, it is necessary to put a larger amount of energy to maintain the plasma state, whereby the energy density of the plasma tends to be high, and the temperature of diamond in contact therewith tends to be high. Consequently, it becomes difficult to control the etching treatment because the etching rate tends to be too high, or the temperature tends to be non-uniform. In order to obtain needle-like diamond or fibrous diamond, the pressure is usually from $10^{-2}$ to 600 Torr, preferably from 1 to 200 Torr, and the temperature of diamond is usually from room temperature to 1,200° C., preferably from 400 to 1,000° C.

As the etching gas for plasma treatment, oxygen is most active among the above-mentioned gases and then carbon dioxide and steam follow. By mixing a rare gas with such gases, it is possible to control the reaction rate or stabilize the plasma. The higher the partial pressure of the reactive gas, the power density and the temperature of diamond to be treated are, the higher the rate of etching becomes. Hydrogen, a halogenated hydrocarbon gas and a halogenated carbon are effective particularly when other materials are present which it is not desirable to expose to an oxidative atmosphere. Further, the surface properties of obtainable diamond vary depending upon the type of the employed reactive gas. In the case where the reactive gas is oxygen, carbon dioxide or steam, oxygen will be chemisorbed on the surface of the obtained diamond In the case of hydrogen, hydrogen will be chemisorbed. In the case of a halogenated hydrocarbon, hydrogen or halogen will be chemisorbed, and in the case of a halogenated carbon, halogen will be chemisorbed.

The surface on which oxygen is chemisorbed, exhibits a hydrophilic nature. Whereas, the surface on which hydrogen or halogen, particularly fluorine, is chemisorbed, exhibits a strong hydrophobic nature. Accordingly, it is advisable to properly select the reaction gas taking the surface properties into consideration depending upon the particular purpose of the needle-like, fibrous or porous diamond.

Figure 3:
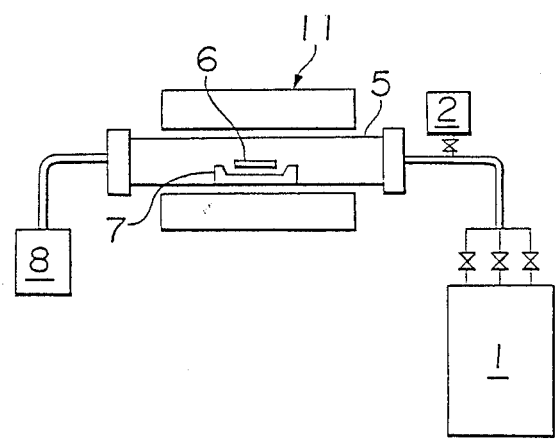
FIG. 3 shows an apparatus for etching treatment by means of heat.

In the thermal oxidation treatment, the diamond to be treated is subjected to heat treatment in a gas stream containing oxygen, carbon dioxide or steam. The apparatus may be, for example, as shown in FIG. 3. In FIG. 3, reference numeral 11 designates an electric furnace or an infrared heating furnace, and other numerals represent the same elements as described with respect to FIG. 1. The operation is the same as described with respect to FIG. 1 except that the heating is conducted by means of the electric furnace or the infrared heating furnace instead of the microwave.

The thermal oxidation treatment is conducted usually under a pressure of from $10^{-2}$ to 1,500 Torr, preferably from 1 to 760 Torr at a temperature of from 400 to 1,200° C., preferably from 500 to 1,000° C.

Now, the morphological change of diamond with treating time under a certain treating condition, will be described with respect to needle-like or fibrous diamond. As the starting material, a polycrystal diamond film having a thickness of 30 μm and a size of 15 mm × 15 mm formed on a silicon substrate by the plasma-assisted vapor deposition method, was used. This film had a columnar structure in which columnar or needle-like crystals having a diameter of from 1 to 2 μm grew substantially perpendicular to the substrate and they appear to be connected to one another. At the initial stage of the etching treatment, the boundary of the columnar crystals was first etched to form a network of narrow grooves on the surface. These grooves rapidly grew in a direction perpendicular to the substrate surface along the boundary. As compared with the etching rate of the boundary, the etching rate of the columnar crystals is substantially lower. If the treatment is stopped at a proper time, the etching terminates substantially at a certain depth from the surface, whereby the film-form is maintained from that position towards the substrate, while needle-like or columnar diamonds having a diameter of from 1 to 2 μm extend substantially in parallel with one another towards the surface, to form a needle-like or columnar diamond aggregate. The morphological state here resembles a wire brush. If the treatment is continued, the etching reaches the substrate surface, whereby the morphological state will be such that needle-like or columnar diamonds having a diameter of from 1 to 2 μm stand perpendicular to the substrate with the length substantially equal to the film thickness (about 30 μm). If the treatment is further continued, the diameter of the needle-like or columnar diamonds gradually becomes thin, and the forward tips tend to be sharp i.e. needle-like, but the length does not substantially change. For example, needle-like or fibrous diamonds having a length of about 30 μm and a diameter of about 0.2 μm will be obtained. The density of such needle-like diamonds on the substrate is from 2 to $8 \times 10^7$ needles/cm$^2$.

After the etching reaches the substrate surface, the needle-like diamonds can easily be separated from the substrate simply by gently touching with a pinset. Otherwise, the silicon substrate may be removed by treatment with a mixture of hydrofluoric acid and nitric acid to separate the needle-like or fibrous diamonds.

By controlling the treating conditions as described above, the needle like or fibrous diamonds can be obtained in an independently separated state or in the form of an aggregate wherein such diamonds are disposed in parallel with one another. Needless to say, this etching treatment may be conducted after the removal of the substrate.

Now, the morphological change of diamond with the treating time under a certain treating condition will be described with respect to the case of porous diamond.

A polycrystal diamond film having a thickness of 20 μm synthesized on a silicon substrate by the plasma-assisted vapor deposition method is used as the starting material. This film has a structure in which crystallites of from 1 to 3 μm are randomly oriented without any particular preferred orientation. At the initial stage of the treatment, numerous pores of not larger than about 0.2 μm appear on the surface of the crystal. If the treatment is continued, the diameter of pores widens, whereby pores not larger than 1 μm will be formed numerously, and at the same time, the specific surface area increases. If the etching proceeds beyond a certain level, pores tend to be connected to one another, and parts of diamond fall off, whereby the specific surface area tends to decrease. As compared with the case of diamond having a columnar structure, this diamond has a feature that there is no substantial difference in the etching rates as between the crystal grain boundaries and the crystallites, and pores show substantially a uniform distribution.

If the structure of the starting material diamond is intermediate between the above two, the morphological feature of diamond obtained by the etching will also be intermediate. For example, there will be obtained branched tree like diamond having trunks and branches of from 1 to 3 μm in diameter and partly having pores.

According to the method of the present invention, it is possible to readily and efficiently produce needle-like, fibrous or porous diamond or an aggregate thereof. Needle-like or fibrous diamond may be used as a filler material useful for the preparation of a composite material in combination with metals, plastics, ceramics and various other materials, whereby it is possible to obtain a material having excellent mechanical, thermal and chemical properties such as high strength, high abrasion resistance, high thermal conductivity and high corrosion resistance. Further, porous diamond can be used as a highly corrosion resistant adsorbent by virtue of its large specific surface area.

The unique aggregate composed of diamond needles upstanding parallel to one another at the surface side and of a film form diamond at the opposite side, may find versatile applications as follows:

(1) Application as cutting or grinding tools: Metals may be filled into space between the needles and the diamond film can be firmly bonded to a base material by means of the filled metal. Better adhesion is currently regarded as a main target of research and development of diamond-coating particularly for cutting tool application. The diamond aggregate of the present invention may be used where high adhesion strength between diamond film and base material is required.

(2) Application to thermal printers: By minimizing the thickness of the film part and by filling the space with proper materials, a composite film which has a high thermal conductivity perpendicular to the film surface and much lower conductivity parallel to the surface, can be obtained. A high resolution, high speed and long life thermal printer head may be produced when such a film with high anisotropy in thermal conductivity is used for coating a printer head.

(3) Application to heat radiation or heat exchanging devices: Assembly of parallel needles of the size obtained in the present invention has high apparent emissivity for light and also has high surface area. Together with high thermal conductivity of diamond, the assembly of diamond needles will be useful as high efficiency radiator or absorber of light, and as high efficiency heat exchange coatings.

(4) Application as chemically inert electrode or electron emitter: Electrically conducting needles can be readily obtained by doping diamond with, e.g., boron when growing a film. A dense assembly of conducting needles may be used as an electrode in place of metals, e.g., in aqueous solutions in which metal-corroding electrolytes are used. It may also be used in place of metals as an electron emitter, e.g., under glow discharge conditions where metal-corroding gases are present.

(5) Application to bio-materials: Because of high chemical inertness of diamond and high biocompatibility known with carbon materials, it is inferred that diamond films, aggregate of diamond needles and porous diamond may find various applications as implant coatings, enzyme carriers, microcapsules for medical uses and other biomaterials.

Now, the present invention will be described in further detail with reference to Examples. However, it should be understood that the present invention is by no means restricted to such specific Examples.

EXAMPLE 1

By a plasma-assisted vapor deposition method using a microwave as the excitation source, a diamond film having a thickness of 30 μm was formed from a gas mixture system of methane (3%)-hydrogen on a silicon substrate at a substrate temperature of 850° C. under 40 Torr. This film was confirmed to be diamond containing a small proportion of a non-diamond structure by the X-ray diffraction, the Raman spectroscopy and the density measurement. Further, it was confirmed to have a columnar structure by the scanning electron microscopic observation. This film was treated by the apparatus as shown in FIG. 1 in an oxygen plasma under a pressure of 5 Torr at the film temperature of 600° C. for 10 minutes to obtain an aggregate composed of needle-like diamonds having a length of about 30 $\mu$m and a diameter of from 1 to 2 $\mu$m. These needle-like diamonds were readily separated from the substrate by gently touching them or by removing the silicon substrate by the treatment with a dilute solution of a fluoric acid-nitric acid mixture, and they were recovered in the form of separated independent form.

EXAMPLE 2

A diamond film having a thickness of 30 $\mu$m synthesized under the same condition as in Example 1, was treated in an oxygen plasma in the same manner as in Example 1 except that the treating time was shortened to 5 minutes, to obtain an aggregate of needle-like diamonds wherein needle-like or columnar diamonds having a length of about 20 $\mu$m and a diameter of from 1 to 2 $\mu$m are densely upstanding and the portion of about 10 $\mu$m in thickness from the substrate remained to be in the filmform. The density of the needle-like diamonds was about $5 \times 10^7$ needles/cm$^2$. This aggregate maintained the same morphological state even after the removal of the silicon substrate by the treatment with a solution of a hydrofluoric acid-nitric acid mixture. Thus, it was recovered as a self-supporting aggregate of needle-like diamonds without substrate.

EXAMPLE 3

A diamond film having a thickness of 30 $\mu$m synthesized under the same condition as in Example 1 was treated by means of the apparatus as shown in FIG. 2 in a carbon dioxide plasma under 10 Torr at a film temperature of 600° C. for 30 minutes, to obtain needle-like diamonds having a length of about 30 $\mu$m and a diameter of from 1 to 2 $\mu$m. These diamonds exhibited a hydrophilic nature.

EXAMPLE 4

A diamond film having a thickness of 30 $\mu$m synthesized under the same condition as in Example 1, was treated by means of the apparatus as shown in FIG. 1 in a plasma of a gas mixture comprising a water vapor under a pressure of 5 Torr and argon under a pressure of 20 Torr at a film temperature of 700° C. for 10 minutes, to obtain an aggregate of needle-like or columnar diamonds in which needle-like or columnar diamonds having a length of about 15 $\mu$m and a diameter of from 1 to 2 $\mu$m were densely upstanding and the portion of about 15 $\mu$m in thickness from the substrate remained to be in the film-form.

EXAMPLE 5

By a chemical vapor deposition method using a tungsten filament heated to 2,000° C. by conducting electric current, a diamond film having a thickness of 30 $\mu$m was formed from a gas mixture of methane (2.5%)-hydrogen on a silicon substrate at a substrate temperature of 850° C. under 40 Torr. This film was treated by means of the apparatus as shown in FIG. 1 in a hydrogen plasma under 80 Torr at a film temperature of 980° C. for 20 minutes, to obtain an aggregate of needle-like or columnar diamonds wherein needle-like or columnar diamonds having a length of about 10 $\mu$m and a diameter of from 0.5 to 1 $\mu$m were densely upstanding and the portion of about 20 $\mu$m in thickness from the substrate remained to be in the film-form. This aggregate exhibited a hydrophobic nature.

EXAMPLE 6

A diamond film having a thickness of 30 $\mu$m synthesized under the same condition as in Example 6, was treated by means of the apparatus as shown in FIG. 2 in a plasma of a gas mixture comprising perfluoromethane (CF$_4$) under a pressure of 5 Torr and argon under a pressure of 40 Torr at 880° C. for 30 minutes, to obtain an aggregate of needle-like diamonds, wherein needle-like or columnar diamonds having a length of about 5 $\mu$m and a diameter of from 0.5 to 1 $\mu$m were densely upstanding, and the portion of about 25 $\mu$m in thickness from the substrate remained to be in the film form. This aggregate exhibited a hydrophobic nature.

EXAMPLE 7

A diamond film having a thickness of 30 $\mu$m synthesized under the same condition as in Example 1, was treated by means of the apparatus as shown in FIG. 2 in a plasma of gas mixture comprising trifluoromethane (CHF$_3$) under a pressure of 5 Torr and argon under a pressure of 40 Torr at 920° C. for 30 minutes, to obtain an aggregate of needle-like diamonds wherein needle-like or columnar diamonds having a length of about 5 $\mu$m and a diameter of from 0.5 to 1 $\mu$m were densely upstanding, and the portion of about 25 $\mu$m in thickness from the substrate remained to be in the film-form. This aggregate exhibited a hydrophobic nature.

EXAMPLE 8

A diamond film having a thickness of 30 $\mu$m synthesized under the same condition as in Example 1, was treated for oxidation by means of the apparatus as shown in FIG. 3 in an oxygen stream under 100 Torr at 700° C. for 20 minutes. Then, a thin layer of graphite formed partly on the film was removed by treating it by means of the apparatus as shown in FIG. 1 in a hydrogen plasma under 30 Torr for 5 minutes, to obtain an aggregate of needle-like diamonds, in which needle-like or columnar diamonds having a length of about 10 $\mu$m and a diameter of from 1 to 2 $\mu$m were densely upstanding, and the portion of about 20 $\mu$m in thickness from the substrate remained to be in the film-form. This aggregate exhibited a hydrophobic nature.

EXAMPLE 9

A diamond film having a thickness of 30 $\mu$m synthesized under the same condition as in Example 1, was treated by means of the apparatus as shown in FIG. 3 in a carbon dioxide stream under 200 Torr at 800° C. for 30 minutes, to obtain an aggregate of needle-like diamonds, in which needle-like or columnar diamonds having a length of about 15 $\mu$m and a diameter of from 1 to 2 $\mu$m were densely upstanding, and the portion of about 15 $\mu$m in thickness from the substrate remained to be in the film form.

EXAMPLE 10

By a plasma-assisted vapor deposition method using a microwave as the excitation source, a diamond film having a thickness of 30 $\mu$m was formed from a gas mixture system of methane (2%)-hydrogen on a silicon substrate at a substrate temperature of 850° C. under 40

Torr. This film was confirmed to be diamond by the X-ray diffraction and the Raman spectroscopy Further, from the observation of the cross section of the film by a scanning electron microscope, this film was confirmed to have a structure similar to the columnar structure in Example 1, which was however not so distinct as in Example 1. This film was treated by means of the apparatus as shown in FIG. 1 in an air plasma under a pressure of 15 Torr at a film temperature of 600° C. for 40 minutes, to obtain slightly curved branched tree-like or coral-like diamonds. Each branched tree-like diamond had a length of about 30 μm and composed of a trunk and branches of from 1 to 2 μm in diameter.

EXAMPLE 11

By a plasma-assisted vapor deposition method using a microwave as the excitation source, a diamond film having a thickness of 10 μm was formed from a gas mixture system of methane (0.3%)-hydrogen on a silicon substrate at a substrate temperature of 850° C. under 40 Torr. This film was confirmed to be diamond in which crystals of not larger than about 3 μm are randomly aggregated. This film was treated by means of the apparatus as shown in FIG. 1 in an oxygen plasma under a pressure of 5 Torr at a film temperature of 600° C. for 40 minutes, to obtain a diamond film having numerous pores having a diameter of at most 1 μm. This porous diamond exhibited a hydrophilic nature.

EXAMPLE 12

By a plasma-assisted vapor deposition method using a microwave as the excitation source, diamond was formed from a gas mixture of methane (0.3%)-hydrogen on a silicon substrate at a substrate temperature of 820° C. under 40 Torr. By means of a scanning electron microscope, the diamond on the substrate was confirmed to be either idependent single crystal particles of a few μm or polycrystals wherein crystallites of at most about 2 μm were randomly aggregated. The diamond was treated by means of the apparatus as shown in FIG. 2 in an air plasma under 15 Torr at 600° C. for one hour, to obtain porous diamond single crystals and polycrystals having numerous pores of at most 1 μm in diameter.

EXAMPLE 13

Diamond synthesized under the same condition as in Example 13, was treated by means of the apparatus as shown in FIG. 1 in a carbon dioxide plasma under 30 Torr at a film temperature of 800° C. for 30 minutes, to obtain a porous diamond having numerous pores of from 1 to 2 μm in diameter.

EXAMPLE 14

A diamond film having a thickness of 10 μm synthesized under the same condition as in Example 12, was treated by means of the apparatus as shown in FIG. in a plasma of a gas mixture of water vapor under a pressure of 15 Torr and argon under a pressure of 20 Torr at a film temperature of 850° C. for 30 minutes, to obtain porous diamond having numerous pores of from 1 to 2 μm in diameter.

EXAMPLE 15

By a chemical vapor deposition method using a tungsten filament heated to 2,000° C. by conducting electric current, a diamond film having a thickness of 10 μm was formed from a gas mixture system of methane (0.3%)-hydrogen on a silicon substrate at a substrate temperature of 850° C. under 40 Torr. This film was treated by means of the apparatus as shown in FIG. 1 in a hydrogen plasma under 80 Torr at a film temperature of 980° C. for one hour, to obtain porous diamond having numerous pores of at most 2 μm in diameter. This porous diamond exhibited a hydrophobic nature.

EXAMPLE 16

A diamond film having a thickness of 10 μm synthesized under the same condition as in Example 16, was treated by means of the apparatus as shown in FIG. 1 in a plasma of a gas mixture comprising perfluoromethane ($CF_4$) under 5 Torr and argon under, 45 Torr at 980° C. for 30 minutes, to obtain porous diamond having numerous pores of from 1 to 2 μm in diameter and a hydrophobic nature.

EXAMPLE 17

A diamond film having a thickness of 10 μm synthesized under the same condition as in Example 12, was treated by means of the apparatus as shown in FIG. 1 in a plasma of a gas mixture comprising trifluoromethane ($CHF_3$) under 5 Torr and argon under 45 Torr at 980° C. for 30 minutes to obtain porous diamond having numerous pores of from 1 to 2 μm in diameter and a hydrophobic nature.

EXAMPLE 18

A diamond film having a thickness of 10 μm synthesized under the same condition as in Example 16, was treated for oxidation by means of the apparatus as shown in FIG. 3 in an oxygen stream under 100 Torr at 700° C. for one hour. Further, a thin layer of graphite formed partly on the film was removed by treating it by means of the apparatus as shown in FIG. 1 in a hydrogen plasma under 30 Torr for five minutes, to obtain porous diamond having numerous pores of from 1 to 2 μm in diameter. This sample exhibited a hydrophobic nature.

EXAMPLE 19

A diamond film having a thickness of 10 μm synthesized under the same condition as in Example 16, was treated by means of the apparatus as shown in FIG. 3 in a carbon dioxide stream under 400 Torr at 800° C. for 50 minutes, to obtain porous diamond having numerous pores of at most 2 μm in diameter. This sample exhibited a hydrophilic nature.

What is claimed is:

1. A method for preparing needle-like, fibrous or porous diamond, or an aggregate thereof, which comprises subjecting diamond synthesized by a chemical vapor deposition method to plasma treatment in a gas stream containing oxygen, carbon dioxide, steam, hydrogen, a halogenated hydrocarbon or a halogenated carbon, for etching.

2. A method for preparing needle-like, fibrous or porous diamond, or an aggregate thereof, which comprises subjecting diamond synthesized by a plasma-assisted vapor deposition method to plasma treatment in a gas stream containing oxygen, carbon dioxide, steam, hydrogen, a halogenated hydrocarbon or a halogenated carbon, for etching.

3. A method for preparing needle-like, fibrous or porous diamond, or an aggregate thereof, which comprises subjecting diamond synthesized by a plasma-assisted vapor deposition method to thermal oxidation treatment in a gas stream containing oxygen, carbon dioxide or steam, for etching.

4. A method for preparing needle-like, fibrous or porous diamond, or an aggregate thereof, which comprises subjecting diamond synthesized by a chemical vapor deposition method to thermal oxidation treatment in a gas stream containing oxygen, carbon dioxide or steam, for etching.

5. The method according to claim 1, wherein the synthesized diamond subjected to etching is in the form of a film of such diamond.

6. The method according to claim 2, wherein the synthesized diamond subjected to etching is in the form of a film of such diamond.

7. The method according to claim 3, wherein the synthesized diamond subjected to etching is in the form of a film of such diamond.

8. The method according to claim 4, wherein the synthesized diamond subjected to etching is in the form of a film of such diamond.

9. The method according to any one of claims 1, 2, 5 or 6, wherein the plasma treatment for etching is conducted under a pressure of from $10^{-2}$ to 600 Torr at a temperature of from room temperature to 1,200° C.

10. The method according to any one of claims 1, 2, 5 or 6, wherein the plasma treatment for etching is conducted under a pressure of from 1 to 200 Torr at a temperature of from 400 to 1,000° C.

11. The method according to any one of claims 3, 4, 7 or 8, wherein the thermal treatment for etching is conducted under a pressure of from $10^{-2}$ to 1,500 Torr at a temperature of from 400 to 1,200° C.

12. The method according to any one of claims 3, 4, 7 or 8, wherein the thermal treatment for etching is conducted under a pressure of from 1 to 760 Torr at a temperature of from 500 to 1,000° C.

* * * * *